United States Patent
Moortgat et al.

(10) Patent No.: US 12,288,943 B2
(45) Date of Patent: *Apr. 29, 2025

(54) METHOD, SYSTEM, AND APPARATUS FOR FINELY PITCHED HIGH SPEED CONNECTOR ATTACHMENT

(71) Applicant: JABIL INC., St. Petersburg, FL (US)

(72) Inventors: Marcel Moortgat, St. Petersburg, FL (US); Wenlu Wang, St. Petersburg, FL (US)

(73) Assignee: JABIL INC.

( * ) Notice: Subject to any disclaimer, the term of this patent is extended or adjusted under 35 U.S.C. 154(b) by 186 days.

This patent is subject to a terminal disclaimer.

(21) Appl. No.: 17/924,086

(22) PCT Filed: May 5, 2021

(86) PCT No.: PCT/US2021/030868
§ 371 (c)(1),
(2) Date: Nov. 8, 2022

(87) PCT Pub. No.: WO2021/226226
PCT Pub. Date: Nov. 11, 2021

(65) Prior Publication Data
US 2023/0178923 A1     Jun. 8, 2023

Related U.S. Application Data

(63) Continuation of application No. 16/867,236, filed on May 5, 2020, now Pat. No. 11,233,353.

(51) Int. Cl.
*H01R 13/516* (2006.01)
*H01R 13/631* (2006.01)
*H05K 1/11* (2006.01)

(52) U.S. Cl.
CPC ......... *H01R 13/516* (2013.01); *H01R 13/631* (2013.01); *H05K 1/111* (2013.01);
(Continued)

(58) Field of Classification Search
CPC .... H01R 13/516; H01R 13/631; H01R 12/89; H01R 13/629; H01R 13/64; H01R 12/721;
(Continued)

(56) References Cited

U.S. PATENT DOCUMENTS 7,057,273 B2 * 6/2006 Harnden ............. H01L 23/3107
257/E23.044
7,453,549 B2 * 11/2008 Suzuki .................. G03F 9/7084
355/75
(Continued)

FOREIGN PATENT DOCUMENTS

KR     1020150084876 A    7/2015
WO        2011052802 A2   5/2011

OTHER PUBLICATIONS

International Search Report for PCT/US2021/030868, dated Aug. 27, 2021.
(Continued)

*Primary Examiner* — Alexander Gilman
(74) *Attorney, Agent, or Firm* — Riverside Law LLP

(57) ABSTRACT

An apparatus, system and method capable of providing a high precision connection between a plurality of pins of a C form factor pluggable (CFP) and a connection pad of a printed circuit board (PCB). The apparatus, system and method include: a connector mask suitable to receive therein a body of the CFP; a ruler suitable to receive therein the connector mask, and sized and shaped for direct physical associated with the PCB about the connection pad; and an adjustment mechanism at least partially passing through the ruler for contacting at least the connector mask and capable of adjusting the position of the pins in relation to the connection pad.

20 Claims, 12 Drawing Sheets

(52) U.S. Cl.
CPC .............. *H05K 2201/10189* (2013.01); *H05K 2201/10409* (2013.01)

(58) Field of Classification Search
CPC ...... H01R 12/732; H01R 13/26; H05K 1/111; H05K 2201/10189; H05K 2201/10409; H05K 2203/166; H05K 3/3405; H05K 2201/10446; H05K 1/18; H05K 1/141; G02B 6/4284
USPC .......................................................... 439/676
See application file for complete search history.

(56) References Cited

U.S. PATENT DOCUMENTS

| | | | | |
|---|---|---|---|---|
| 8,899,994 B2* | 12/2014 | Clayton | ................. | H01R 12/77 439/67 |
| 9,112,302 B2* | 8/2015 | Liao | ...................... | H01R 12/777 |
| 9,225,115 B2* | 12/2015 | Malek | .................... | H01R 12/79 |
| 9,281,597 B2* | 3/2016 | Hashiguchi | .......... | H01R 12/774 |
| 9,509,098 B1* | 11/2016 | Henry | ................ | H01R 13/6471 |
| 9,531,129 B2* | 12/2016 | de Boer | ............ | H01R 13/6471 |
| 9,755,337 B2* | 9/2017 | Brzezinski | ......... | H01R 13/5219 |
| 10,242,941 B1* | 3/2019 | Su | ......................... | H01L 23/562 |
| 10,401,581 B2* | 9/2019 | Gaal | .................. | H05K 7/20154 |
| 10,765,009 B2* | 9/2020 | Mehnert | .............. | H05K 1/0274 |
| 10,833,438 B1* | 11/2020 | Miremadi | ........... | H01R 12/716 |
| 11,233,353 B2* | 1/2022 | Wang | ....................... | H05K 1/18 |
| 2010/0039785 A1 | 2/2010 | Ice | | |
| 2010/0093193 A1* | 4/2010 | Trout | ................... | H01R 12/714 439/74 |
| 2012/0275120 A1 | 11/2012 | Nguyen | | |
| 2014/0148021 A1* | 5/2014 | Hsu | ........................ | H01R 12/79 439/67 |
| 2014/0302692 A1* | 10/2014 | Raff | .................... | H01R 12/716 439/65 |
| 2015/0013936 A1 | 1/2015 | Mack | | |
| 2016/0156114 A1* | 6/2016 | Kao | ..................... | H01R 12/725 439/83 |
| 2017/0125944 A1* | 5/2017 | Yokoyama | ............ | H01R 13/05 |
| 2019/0067853 A1* | 2/2019 | Ehrensvärd | ............ | H01R 13/20 |
| 2019/0099820 A1* | 4/2019 | Su | ....................... | B23K 1/0016 |

OTHER PUBLICATIONS

Written Opinion of the International Searching Authority for PCT/US2021/030868, dated Aug. 27, 2021.

* cited by examiner

METHOD, SYSTEM, AND APPARATUS FOR FINELY PITCHED HIGH SPEED CONNECTOR ATTACHMENT

CROSS-REFERENCE TO RELATED APPLICATION

This National Phase Applications claims the benefit of priority to International Patent Application No. PCT/US2021/030868, filed May 5, 2021, entitled: Method, System, and Apparatus for Finely Pitched High Speed Connector Attachment, which claims the benefit of priority to U.S. application Ser. No. 16/867,236, filed May 5, 2020, entitled Method, System, and Apparatus for Finely Pitched High Speed Connector Attachment, the entireties of which are incorporated herein by reference as if set forth in their entireties.

BACKGROUND

Field of the Disclosure

The present disclosure relates to high speed connections, and, more specifically, to an apparatus, system and method for finely pitched high speed connector attachment.

Description of the Background

The C form-factor pluggable (CFP) is a common form-factor for connections for the transmission of high-speed digital signals. By way of example, CFP, CFP2, CFP4, or CFP8 (in general, "CFPx" connectors) are widely used for optical high speed pluggable modules to interface with a main board in high speed (i.e., 100 Gbps, 200 Gbps, 400 Gbps, 600 Gbps, and higher) optical communication.

Accordingly, ones of the pins of a CFPx connector typically provide a high speed RF signal interface between the CFPx module and host board. Therefore, misalignment between the fine pitched connector pins and the pads of a module PCB may result in signal integrity issue and/or module malfunction because of back reflection and signal loss.

Precision connections are thus critical for volume manufacturing of 100 Gbps, 200 Gbps, 400 Gbps and higher speed optical transceivers. Without the requisite precision, achieving 10×10G, 4×25G, 8×25G, or 8×50G lanes rate between the optical transceiver modules and the host PCB is all but impossible. As referenced above, this is because any misalignment between a connector pin or pins and the pad on a module PCB leads to RF insertion loss, back reflection, cross talk, and consequent module malfunction.

Therefore, the need exists for an improved apparatus, system and method for providing high precision connections

SUMMARY

The disclosure is and includes an apparatus, system and method capable of providing a high precision connection between a plurality of pins of a C form factor pluggable (CFP) and a connection pad of a printed circuit board (PCB). The apparatus, system and method include: a connector mask suitable to receive therein a body of the CFP; a ruler suitable to receive therein the connector mask, and sized and shaped for direct physical associated with the PCB about the connection pad; and an adjustment mechanism at least partially passing through the ruler for contacting at least the connector mask and capable of adjusting the position of the pins in relation to the connection pad.

Thus, the disclosed embodiments provide an improved apparatus, system and method for providing high precision connections.

BRIEF DESCRIPTION OF THE DRAWINGS

The disclosed non-limiting embodiments are discussed in relation to the drawings appended hereto and forming part hereof, wherein like numerals indicate like elements, and in which.

DETAILED DESCRIPTION

Figure 1:
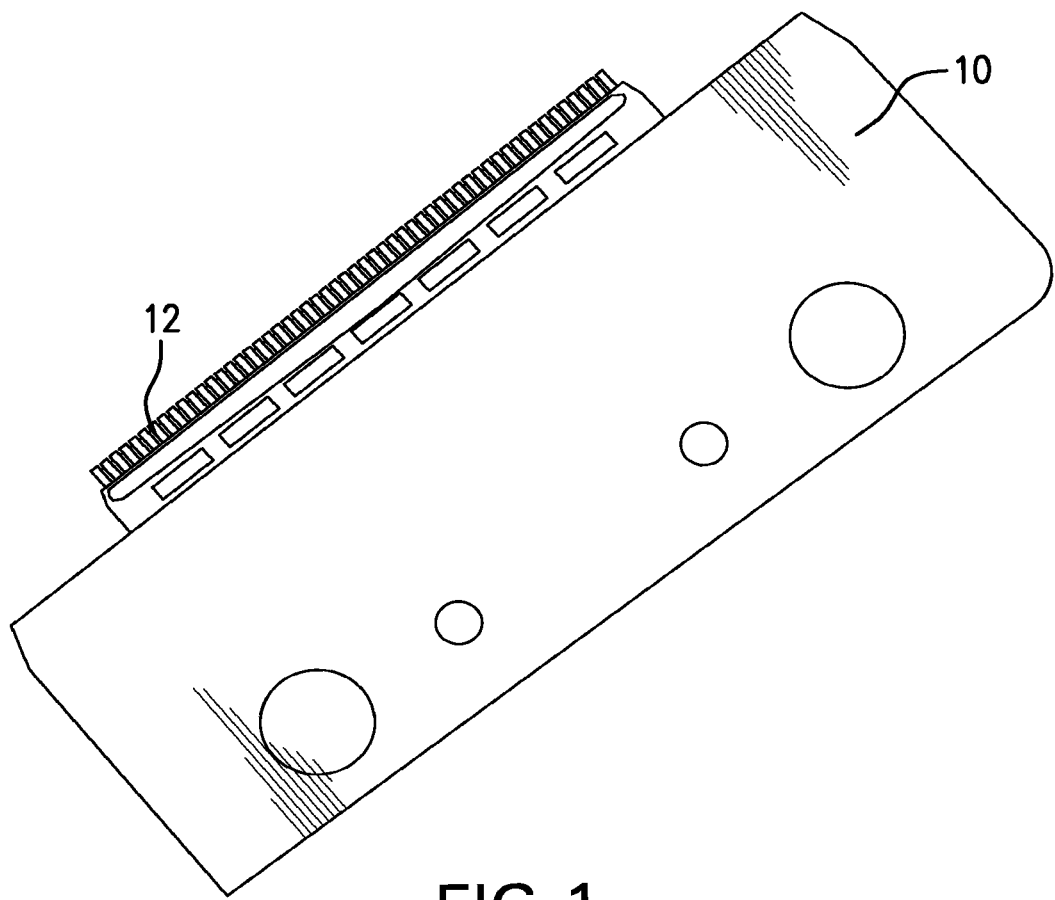
FIG. 1 illustrates a CFPx connector and its holder.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the embodiments should not be construed to limit the scope of the disclosure.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

There are various methodologies to produce the aforementioned precision connection of a CFPx connector. One method is to have a CFPx connector holder 10, as shown in FIG. 1, to hold the CFPx connector 12, in part forming a CFPx connector fixture 14. The holder may then be attached to the PCB board, such as for reflow.

Figure 2:
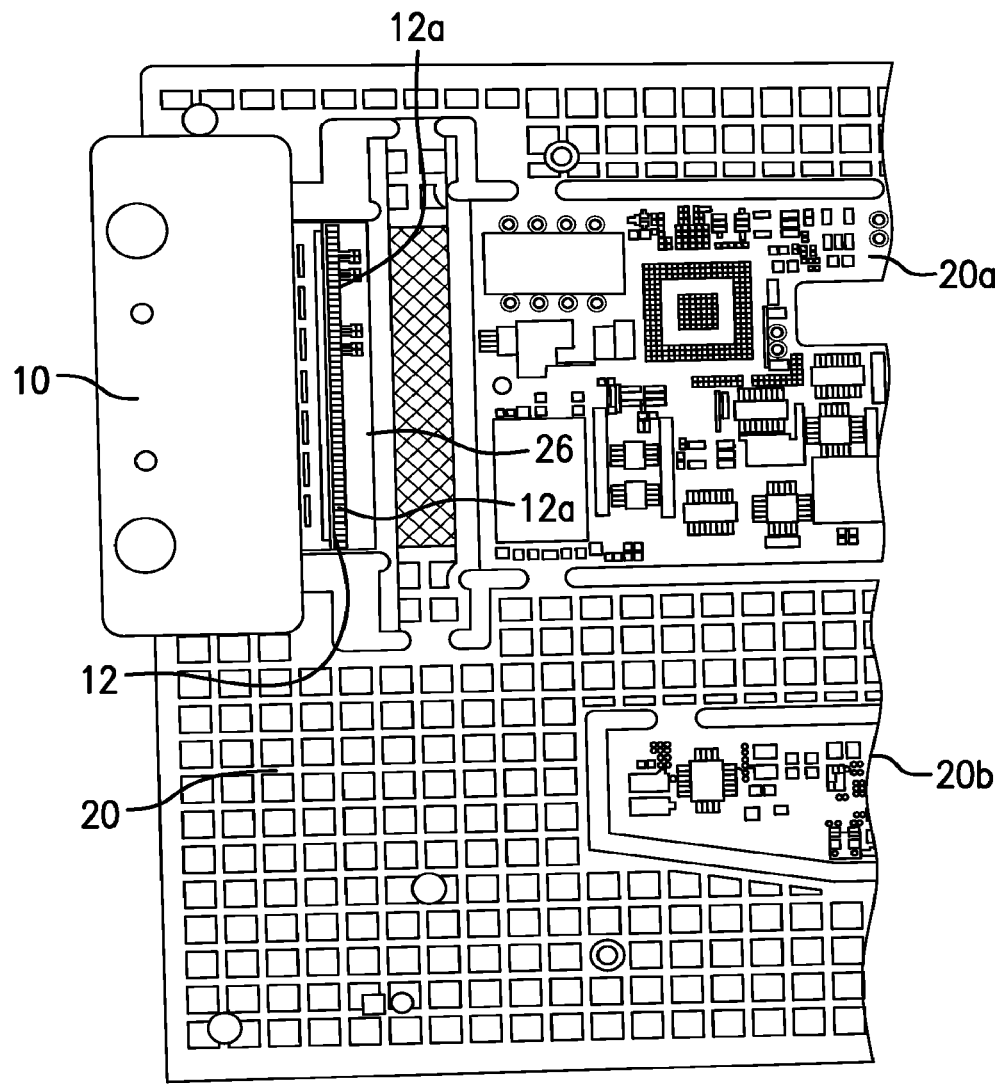
FIG. 2 illustrates association of a CFPx connector with a printed circuit board (PCB) on a PCB panel.

FIG. 2 shows the fixture with the CFPx connector 12 attached to PCB panel 20 using a holder 10. As is evident, one cannot adjust the connector 10 relative to the PCB board 20a to which it is being connected in a typical process; in other words, the CFPx connector pins 12a cannot be adjusted to properly aligned to the PCB pad connection 26. However, the dimensional tolerance control of the PCB by PCB supplier, and the tolerance of the CFPx connector, cannot ensure proper alignment of the pin relative to the pad without such an adjustment in a typical connection process.

Figure 3A:
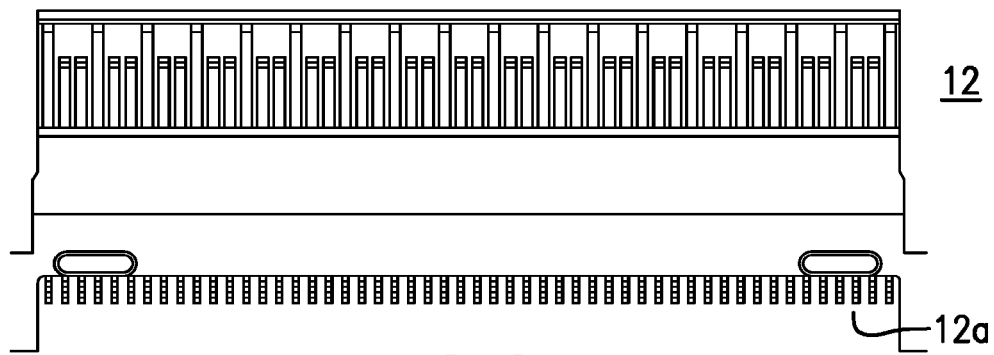
FIG. 3A illustrates the pins of a CFPx connector, and a type of PCB pin receiver.
Figure 3B:
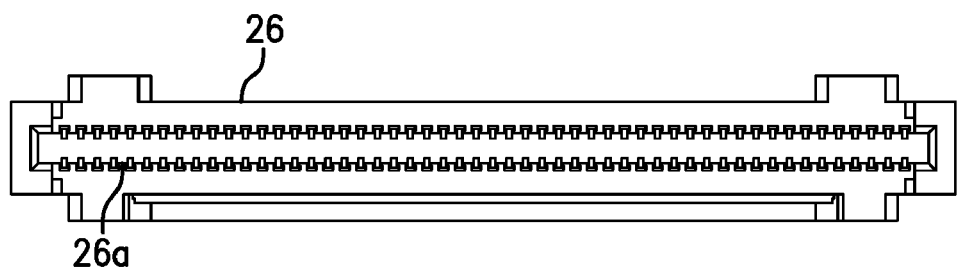
FIG. 3B illustrates the pins of a CFPx connector, and a type of PCB pin receiver.

FIG. 3 show a CFPx connector 12, and PCB connection 26. The CFPx connector 12 shown has male connectors 12a, with the female mating sides 26a attached to the module PCB. The connector 12 is typically a molded polymer construction with plated metal contact inserts 12a. The contact pitch in the example is 0.6 mm and there are 104 contacts, with 52 pins on top and 52 pins bottom side of the connector 12, to be attached to the top side pads and bottom side pads 26a of the module PCB (as is also shown in FIG. 2).

Figure 4:
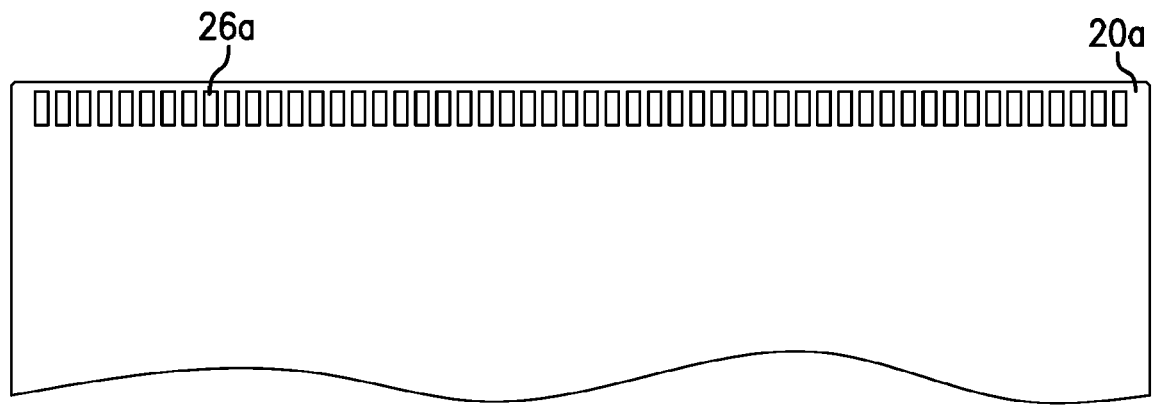
FIG. 4 illustrates a PCB pin receiver pad.

FIG. 4 shows the module board 20a. The module PCB 20a may have a width of 32.25 mm with a tolerance of +/−0.10 mm, and the edge pad may have 0.075 mm location tolerance from edge, by way of example. However, leading PCB suppliers typically only meet 0.10 mm of tolerance, and some can only meet 0.15 mm of tolerance. However, the positional tolerance of the pad 26 and the dimension tolerance of the PCB size have significant impact on the alignment of the connector pin (not shown in FIG. 4) to the pad. Table 1 summarizes an exemplary tolerance analysis based on the CFP MSA recommendation of particular connector dimension specifications, and the CFP MSA recommendation of the module PCB specification.

Moreover, Table 1 summarizes the alignment tolerance stack between an exemplary CFP2 connector and an exemplary CFP2 PCB pad, with specifications recommended by MSA and the CFP2 connector suppliers. As shown, with passive placement of the CFP2 connector to the CFP PCB, a 100% overhang of the connector pin relative to pad on PCB can result. It goes without saying that this result is highly undesirable for the CFP2 assembly.

TABLE 1

| CFP2-plug alignment tolerance stack-up (mm) | | | |
|---|---|---|---|
| | Nominal | tolerance | Note |
| CFP2 Module PCB width | 32.25 | +/−0.1 | MSA specification |
| Pads location relative to Edge | | +/−0.05 | MSA specification |
| Pad Width | 0.35 | +/−0.03 | MSA specification |
| Pad pitch | 0.6 | | MSA specification |
| CFP2 Plug space width | 32.4 | +/−0.05 | MSA |
| pin width | 0.2 | | MSA |
| Pitch | 0.6 | | MSA |
| Max position error | 0.3 | | CFP2 plug to PCB |
| Add pad location error | 0.35 | | +pad location error |
| Nominal Gap allowed | 0.075 | | |
| Max alignment error Pin to Pad | 0.275 | | 100% overhang |

Figure 5:
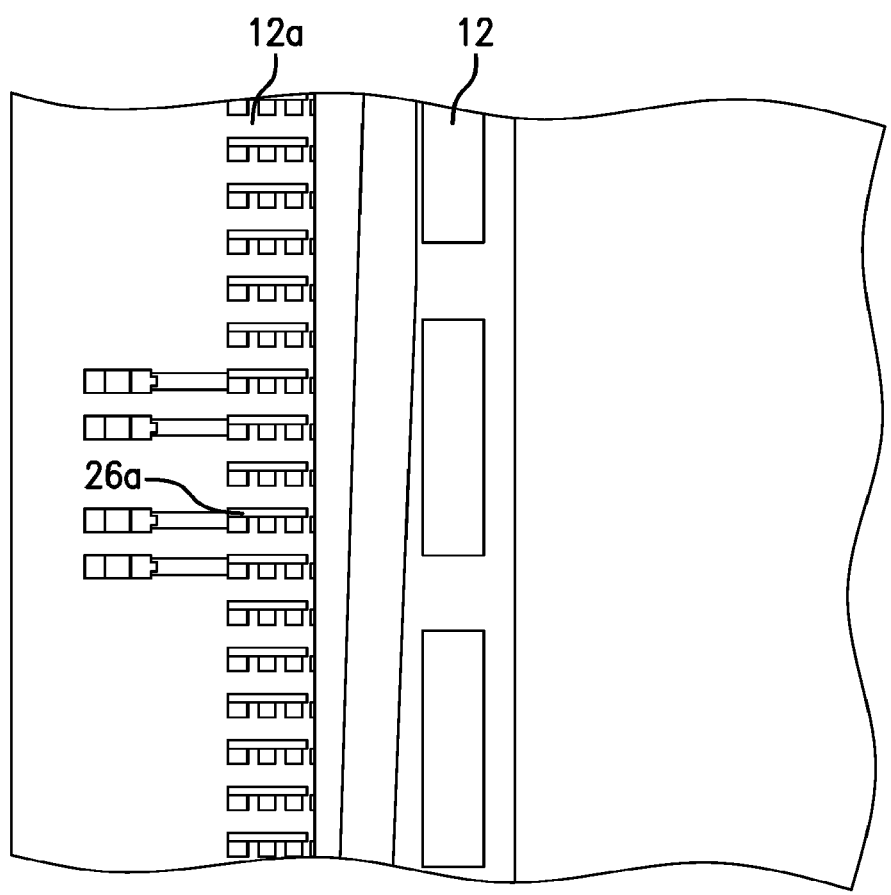
FIG. 5 illustrates misalignment of CFPx pins and PCB receiver pads.
Figure 6:
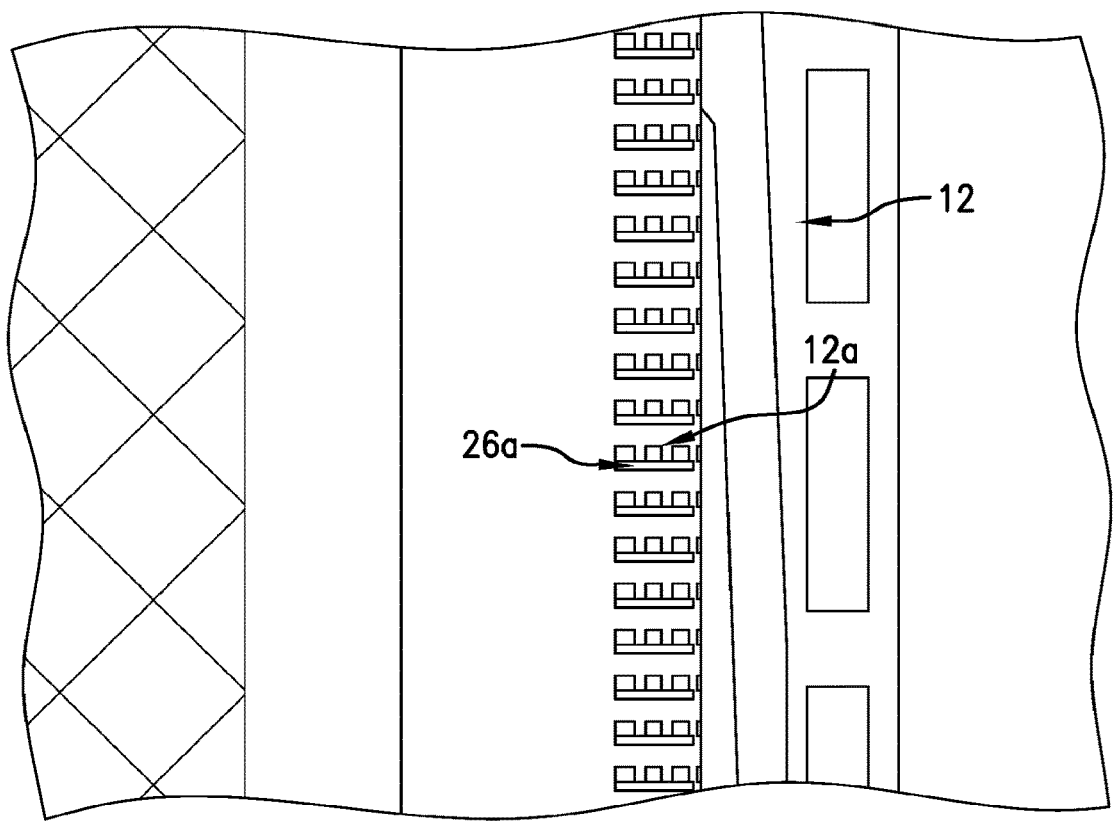
FIG. 6 illustrates a prospective alignment of CFPx pins and PCB receiver pads.

In the aforementioned worst case, the CFP2 connector pin 12a is in 100% overhang the PCB pad 26a, and this is shown photgraphically in FIG. 5. Such an overhang will lead to bad connectivity for the majority of pins 12a, and thus will likely result in malfunction of the assembled module. Given that the PCB manufacturer's manufacturing tolerance usually cannot meet the MSA recommended requirement, an even worse alignment may result. As shown in FIG. 6, the CFP2 connector pins 12a may be totally misaligned to the PCB pads 26a, which leads to an open circuit between the CFP2 connector pins 12a and the CFP2 module pads 26a. After soldering, this will result in a short between pins.

Figure 7:
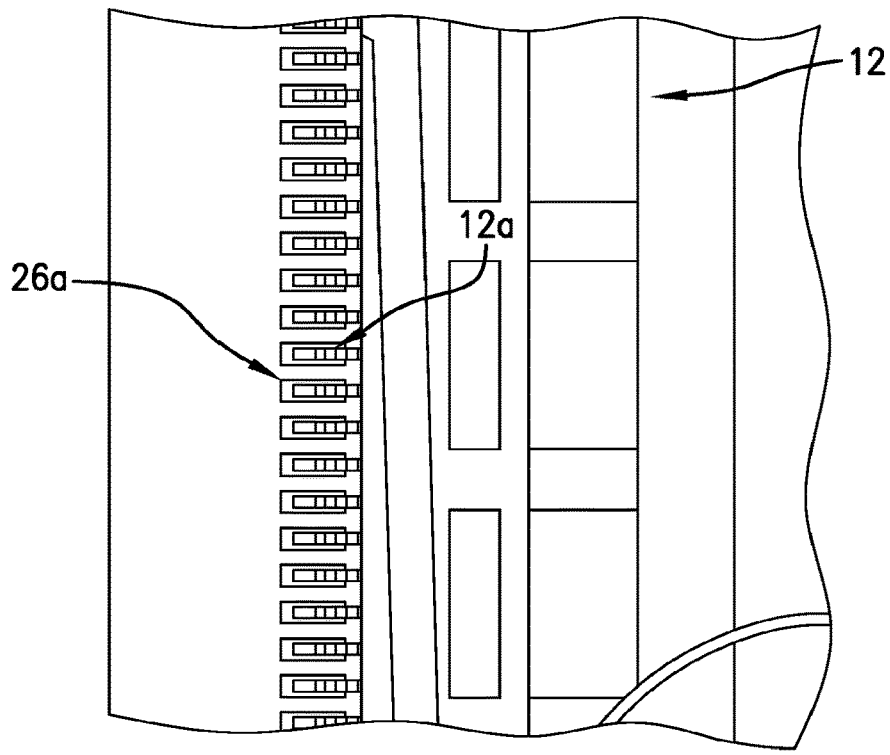
FIG. 7 illustrates a prospective alignment of CFPx pins and PCB receiver pads.
Figure 8:
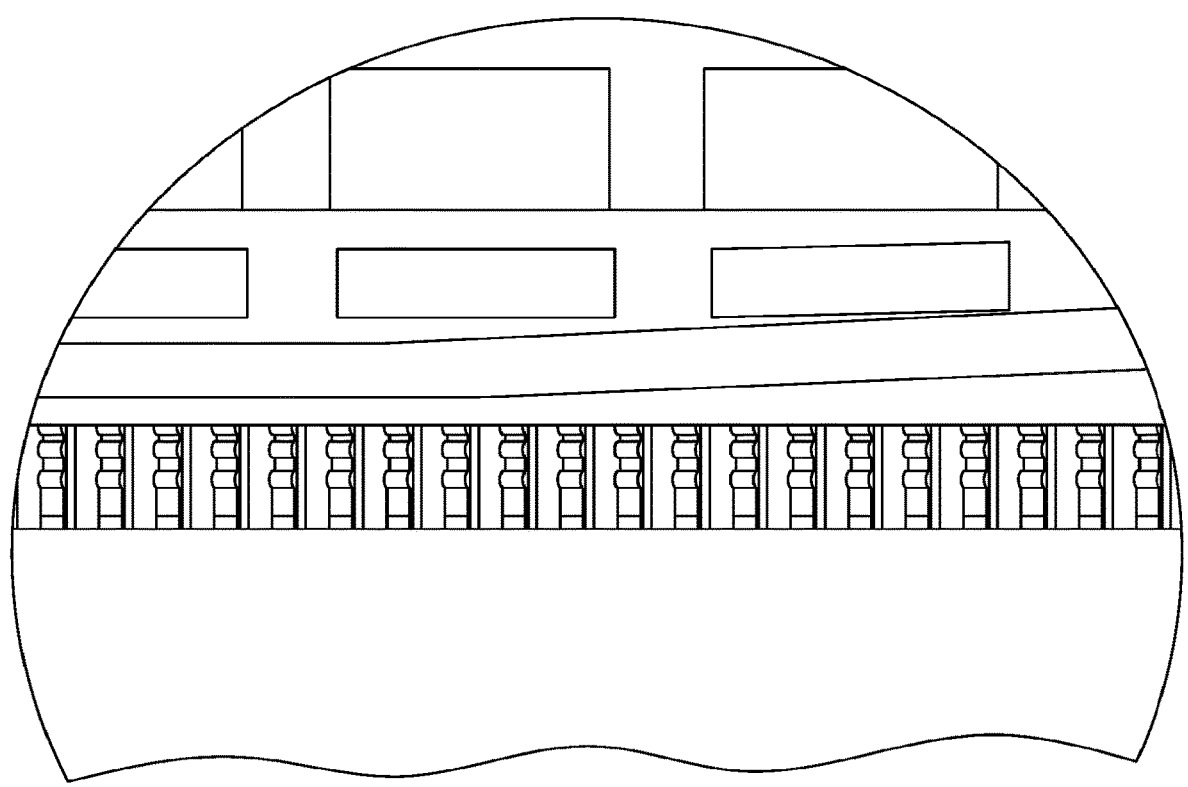
FIG. 8 illustrates a prospective alignment of CFPx pins and PCB receiver pads.

Yet further, the CFP2 PCB supplier cannot typically guarantee the pad location error relative to the PCB edge within +/−0.05 mm. This will result in an alignment error under passive placement of up to 0.375 mm, or the disjointing of the CFP2 connector pin from the CFP2 PCB pad, i.e., an open circuit. FIG. 7 illustrates a CFP2 connector pin 12a that is well aligned with a PCB pad 26a. On the contrary, FIG. 8 photographically shows a CFP2 connector misaligned to PCB pad with up to a 90% overhang after reflow attachment.

A slightly improved alignment of the connector to the PCB can be achieved under microscope; however, when putting the aligned assembly back into the SMT reflow, the connector pins may still slip away or walk off of solder on pads, due to the lack of any mechanism to hold the connector in place after the alignment. Furthermore, the alignment is so sensitive that it is very time consuming, and thus is not ideal for any volume production, especially in the SMT reflow line wherein each step occurs within seconds or less.

Another prospective solution is to tighten the specifications on the CFP2 connector, and on the PCB dimensions. In this case, the tightly specified PCB dimension is very expensive to build, as would be the CFP2 connector. This heightened expense not only increases the module cost, but also significantly reduces the number of alternative suppliers, thus creating a significant issue in the supply chain.

Therefore, in sum: CFPx connectors and CFPx module PCB cannot achieve passive placement due to typical specifications; misalignment between the fine pitched pin CFPx connector and the PCB board results in high costs and timing inefficiencies; heightened tolerances are too inefficient to achieve optimum alignment of the connector pin to the PCB pad; passive fixture of an alignment results in poor yield; a microscopic alignment is very time consuming, and can slip after alignment; and any material used for alignment fixture for a CFPx connector has to endure reflow temperatures. Thus, a tool, method, mechanism and system to align the finely pitched pin connector to a CFPx module PCB, and to hold the connector in place during SMT reflow, is needed.

The embodiments provide a fixture, i.e., a connector mask (holder) 900, to hold the CFPx connector 12 in place; a second fixture, herein also referred to as a ruler 902, for attachment to a PCB 20a; and a mechanism 904 to adjust the connector mask 900 to hold the CFPx connector 12 relative to the PCB 20a during attachment. More specifically, FIG. 9 illustrates the connector mask holder 900 holding the CFPx connector 12 adjacent a PCB 20a for connection, and a ruler 902 having an adjustment mechanism 904 comprised of an adjustment screw 904a against plate 904b, and a spring 904b, to both hold the connector mask 900, with the CFPx connector 12 therein, in place, and to allow for positional adjustment of the CFPx connector 12 in relation to the PCB 20a.

The ruler 902 may be positioned on PCB panel for ultimately receiving the CFPx connector to the PCB panel at the desired connection location. The ruler 902 may be at least partially held in place by a variety of connectors, such as set screws, springs, or the like, that hold the ruler in place and/or may additionally allow for actuation of a positional adjustment of the ruler with respect to the PCB.

Figure 9:
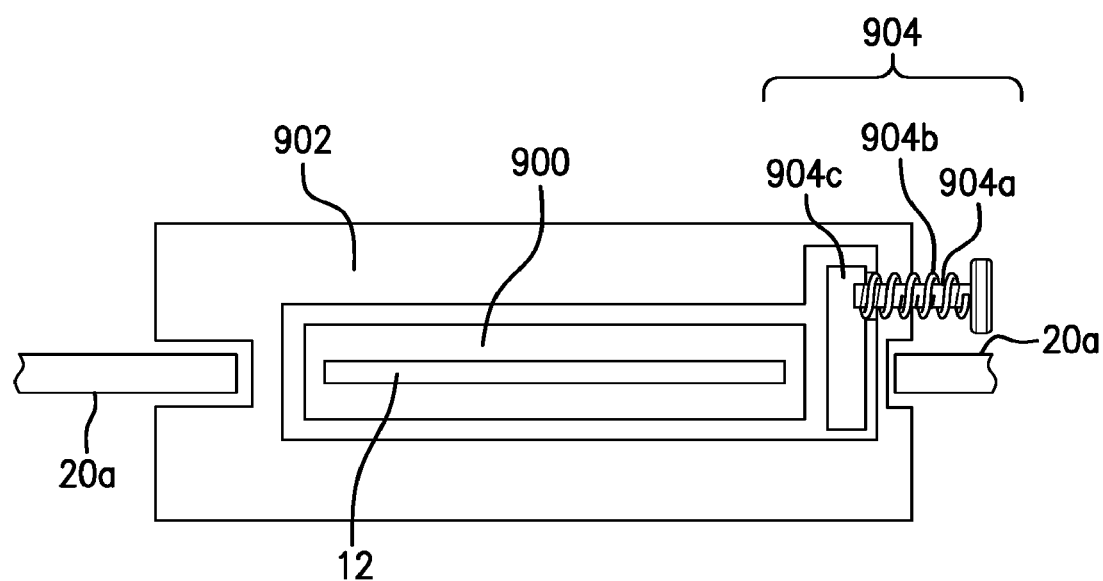
FIG. 9 illustrates aspects of a high precision connection fixture.

Although the illustration of FIG. 9 includes an adjustable mechanism to maintain alignment during processing in the form of a plate/spring and dial, those skilled in the art will appreciate that other forms of adjustable mechanisms, such as cams, flex clips, or the like, may be used. Yet further, the connector mask and ruler may be of any suitable construction to impart any necessary rigidity or flexibility, although lightweight non-conductors may be preferred, such as rubber, plastic or the like.

Figure 10:
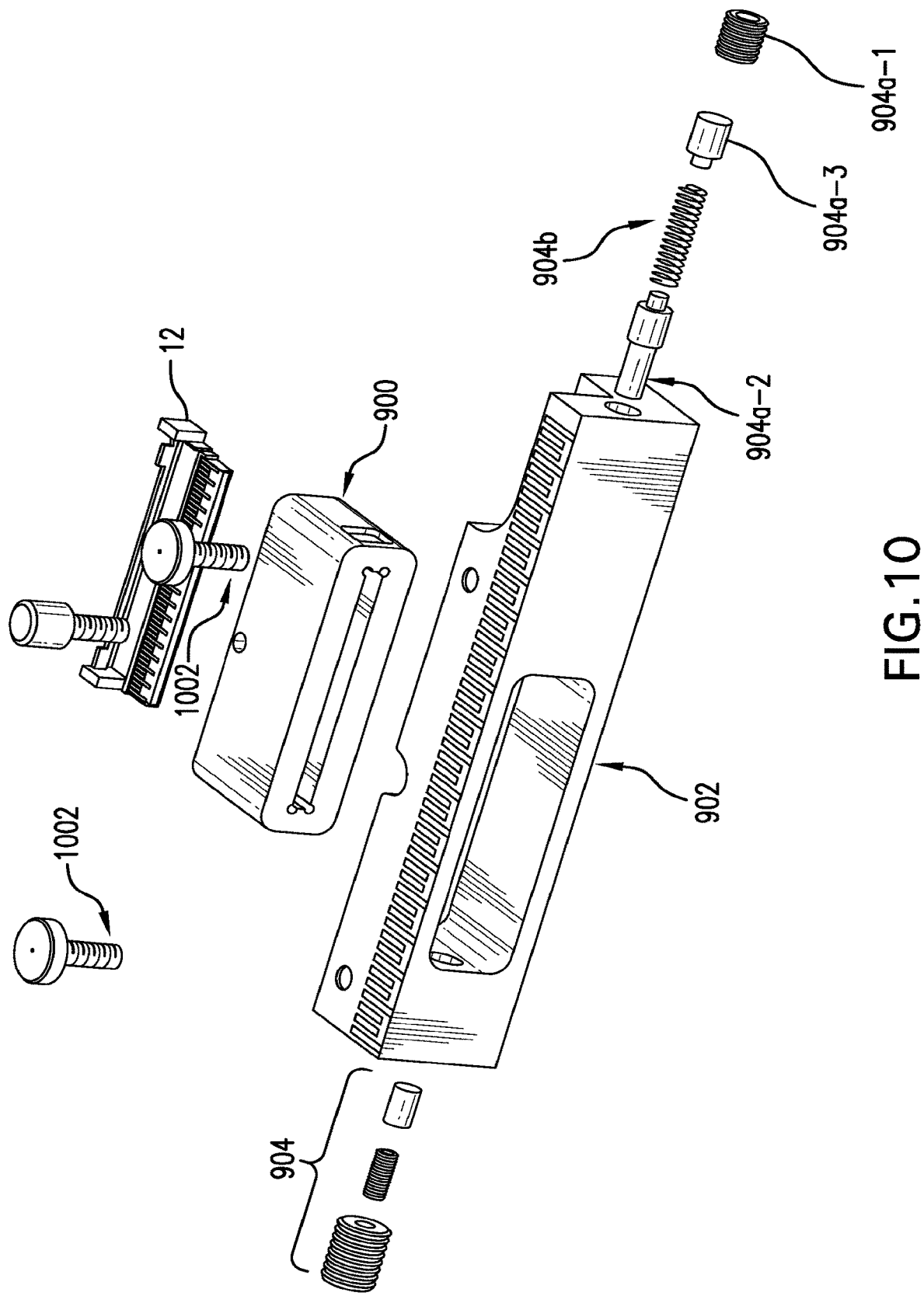
FIG. 10 illustrates aspects of a high precision connection fixture.

FIG. 10 is an exploded view of a CFPx connector fixture 1000, including alignment and attachment. Again illustrated are a CFPx connector 12, a connector mask 900 inserted to a ruler 902, place holders 1002 for the ruler 902 to be held in place, and at least one adjustment mechanism 904.

Figure 11:
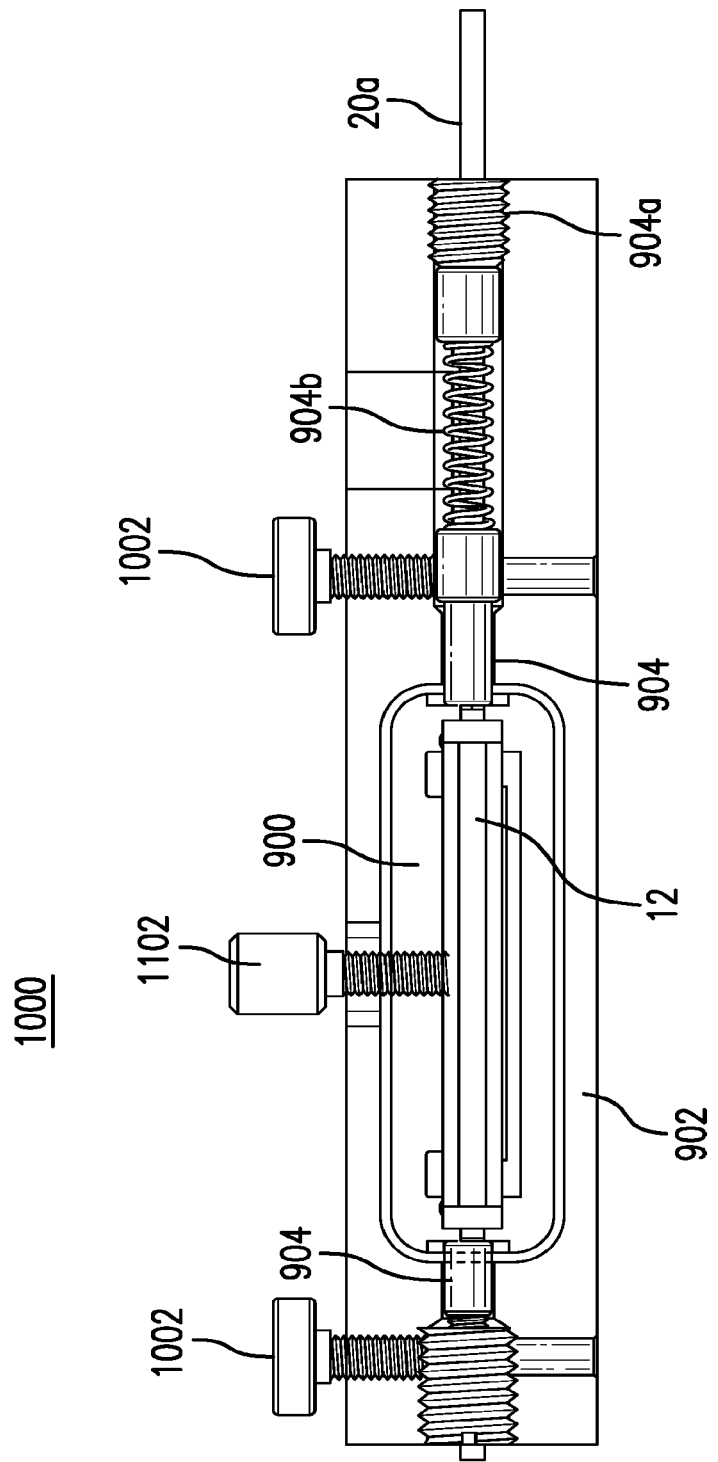
FIG. 11 illustrates aspects of a high precision connection fixture.

FIG. 11 is a front transparent view of the fixture design 1000. Illustrated is a mask 900 held in place at least by spring loaded pushers 904. Of note, the CFPx connector pins (not shown in FIG. 11) of connector 12 within the mask 900 may be aligned to the CFPx pad on the PCB 20a by adjusting the adjustable portion of the adjustment mechanism 904 associated with the ruler 902, i.e., a screw 904 on the side of the ruler 902 and an associated spring 904b in the illustrated example.

Figure 12:
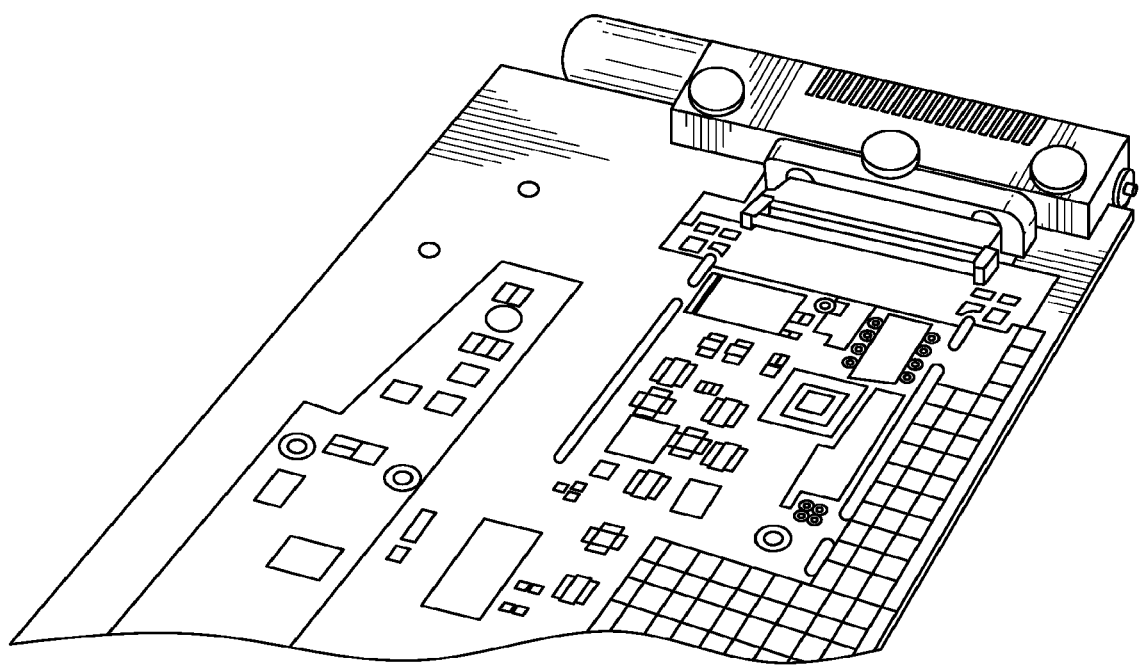
FIG. 12 illustrates aspects of a high precision connection fixture.

FIG. 12 is a photographic illustration of the disclosed ruler upon a PCB at the attachment pad location. Also evident from the illustration are two ruler bracing screws, as well as a thumb screw to frictionally engage the mask.

Figure 13:
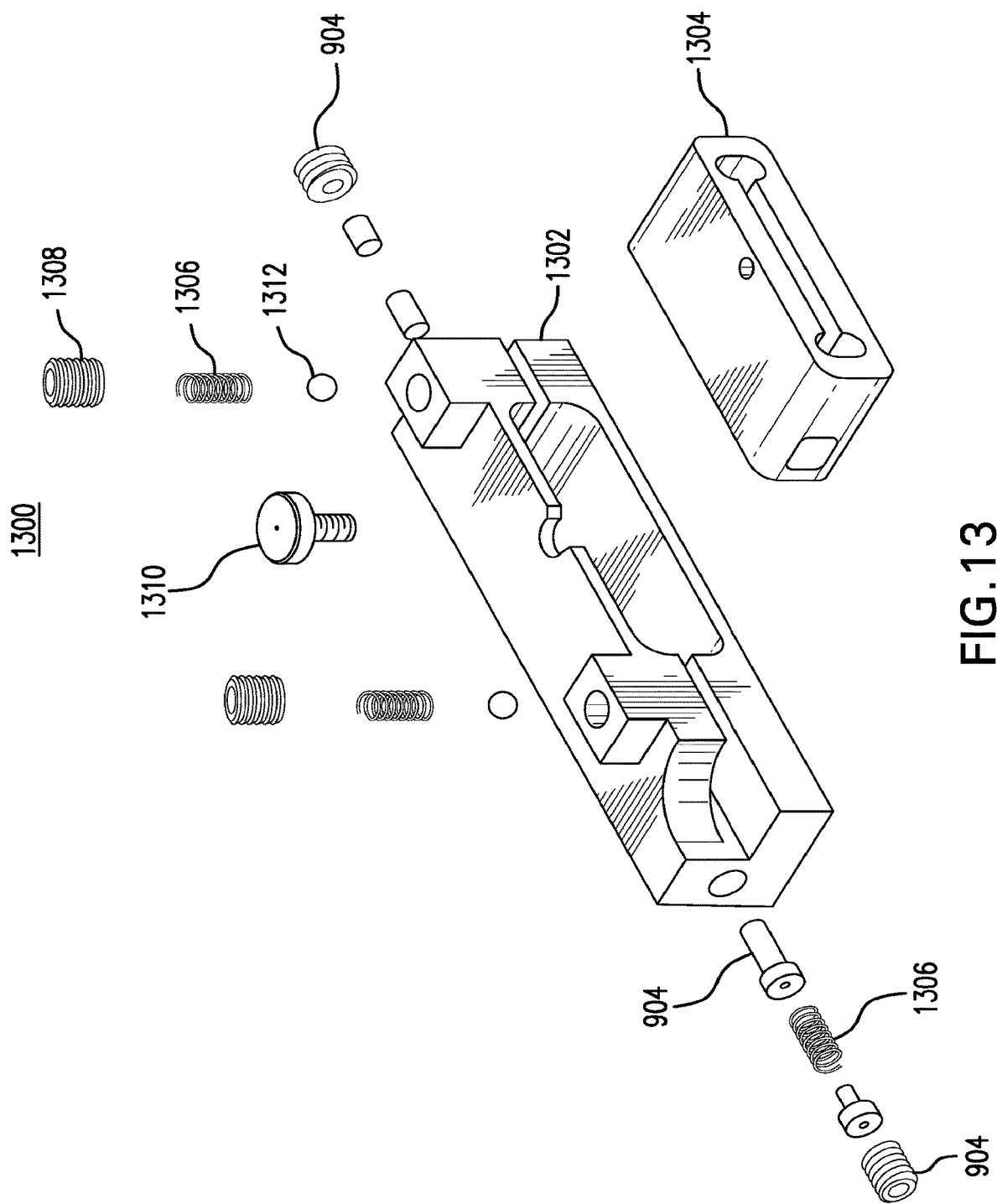
FIG. 13 illustrates aspects of a high precision connection fixture.

FIG. 13 illustrates shows an additional embodiment of a CFPx alignment fixture 1300. The illustration includes ruler 1302, mask 1304, a plurality of spacers, fix pins and screws, an adjustment spring 1306 that adjusts via screw 1308, a bracing screw 1310 to grip mask 1304 within ruler 1302, and, rather than the two screws to hold the ruler to the PCB as detailed above, two spring loaded balls 1312 hold the fixture onto the PCB panel. Yet further, replacing the two screws detailed above with spring loaded balls 1312 may enhance ease of operation and may save on assembly time in a SMT process flow.

In an exemplary process for the attachment of the fixture to substrate, the CFPx connector may first be placed into the CFPx connector alignment fixture. The fixture, with the CFPx connector therein, is placed onto the PCB panel. The CFPx connector pin is aligned to the connection pad on the PCB via an adjustment of the side screw on the alignment fixture.

The PCB is then reflowed while the alignment fixture holds the CFPx connector in place in precise alignment to the PCB pads. The alignment fixture may thereafter be removed from the reflowed PCBA by loosening the screw(s).

Figure 14:
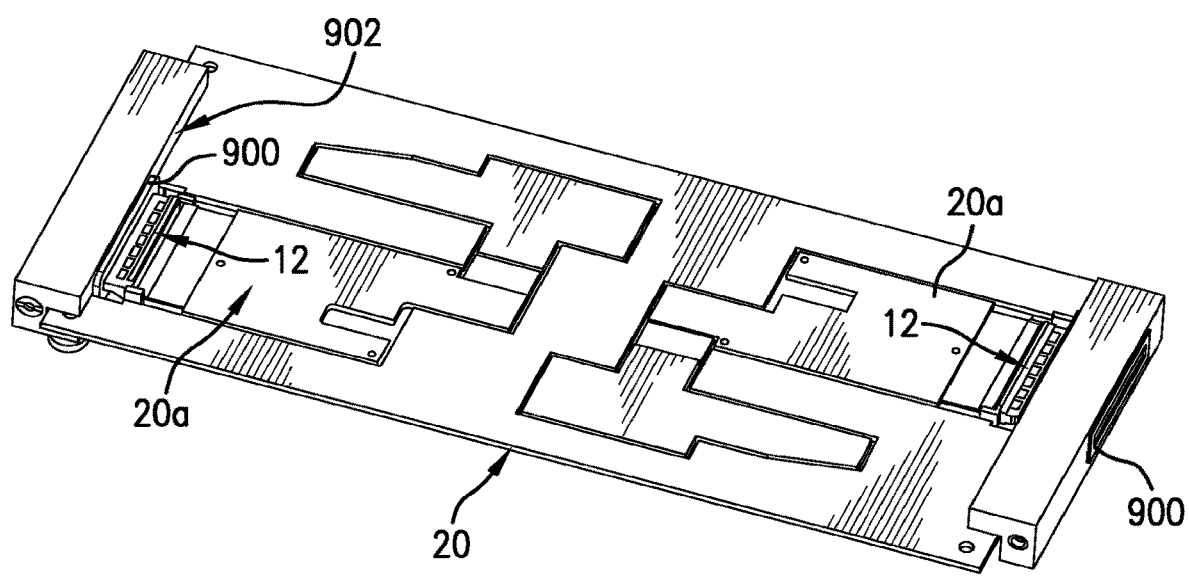
FIG. 14 illustrates aspects of a high precision connection fixture.

Alternatively, each panel 20 may include multiple CFPx PCBs 20a. Accordingly, multiple alignment fixture comprised of masks 900 and rulers 902 may be used to hold and align each CFPx connector 12 to its respective PCB 20a, as shown in FIG. 14.

In the foregoing detailed description, it may be that various features are grouped together in individual embodiments for the purpose of brevity in the disclosure. This method of disclosure is not to be interpreted as reflecting an intention that any subsequently claimed embodiments require more features than are expressly recited.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A fixture capable of providing a high precision connection between a plurality of pins of a C form factor pluggable (CFP) and a connection pad of a printed circuit board (PCB), comprising:
   a connector mask suitable to receive therein a body of the CFP;
   a ruler suitable to receive the connector mask therein, and sized and shaped for direct physical association with the PCB about the connection pad; and
   an adjustment mechanism at least partially passing through the ruler and contacting the body of the CFP to adjust the position of the pins in relation to the connection pad while the pins of the CFP are positioned within the ruler.

2. The fixture of claim 1, wherein the CFP is a CFP2.

3. The fixture of claim 1, wherein the PCB is associated with a PCB panel.

4. The fixture of claim 3, wherein the PCB panel comprises multiple ones of the PCBs.

5. The fixture of claim 1, wherein the ruler attaches to the PCB via a plurality of set screws.

6. The fixture of claim 1, wherein the CFP is held within the connector mask via a set screw.

7. The fixture of claim 1, wherein the adjustment mechanism comprises a rotating dial.

8. The fixture of claim 7, wherein the rotating dial is associated with a spring thereabout.

9. The fixture of claim 7, wherein the rotating dial presses against a plate in contact with the connector mask.

10. The fixture of claim 1, wherein the adjustment mechanism comprises at least one of cams and flex clips.

11. The fixture of claim 1, wherein the adjustment mechanism is at least partially provided by a composition of the ruler.

12. The fixture of claim 1, wherein a composition of the ruler is non-conductive.

13. The fixture of claim 1, wherein a composition of the ruler is rigid.

14. The fixture of claim 1, wherein a composition of the connector mask is one of rubber or plastic.

15. The fixture of claim 1, wherein a composition of the connector mask is non-conductive.

16. The fixture of claim 1, wherein a composition of the connector mask is flexible.

17. The fixture of claim 1, wherein the ruler attaches to the PCB via a plurality of spring loaded balls.

18. The fixture of claim 1, wherein the adjustment mechanism adjusts the ruler about the connector mask to align the pins to the connection pad.

19. The fixture of claim 18, wherein the adjustment mechanism axially translates the connector mask within the ruler to align the pins.

20. The fixture of claim 1, wherein the adjustment mechanism comprises a first dial passing through the ruler and connector mask on a first side of the fixture and contacting the body of the CFP to adjust the body in a first direction, and a second dial passing through the ruler and connector mask on a second side of the fixture and contacting the body of the CFP to adjust the body in a second direction.

* * * * *